(12) United States Patent
Jeong et al.

(10) Patent No.: US 8,148,779 B2
(45) Date of Patent: Apr. 3, 2012

(54) THIN FILM TRANSISTOR, METHOD OF MANUFACTURING THE SAME AND FLAT PANEL DISPLAY DEVICE HAVING THE SAME

(75) Inventors: Jae-Kyeong Jeong, Suwon-si (KR); Jong-Han Jeong, Suwon-si (KR); Min-Kyu Kim, Suwon-si (KR); Tae-Kyung Ahn, Suwon-si (KR); Yeon-Gon Mo, Suwon-si (KR); Hui-Won Yang, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 163 days.

(21) Appl. No.: 12/352,851

(22) Filed: Jan. 13, 2009

(65) Prior Publication Data

US 2009/0321731 A1  Dec. 31, 2009

(30) Foreign Application Priority Data

Jun. 30, 2008 (KR) ................ 10-2008-0062418

(51) Int. Cl.
*H01L 31/0256* (2006.01)
*H01L 29/12* (2006.01)
*H01L 21/02* (2006.01)
*H01L 31/00* (2006.01)

(52) U.S. Cl. ..... 257/347; 257/59; 257/72; 257/E21.002; 257/E21.476

(58) Field of Classification Search .......... 257/347, 257/59–72, E21.002, E21.476
See application file for complete search history.

(56) References Cited

U.S. PATENT DOCUMENTS

| 2003/0047785 A1 | 3/2003 | Kawasaki et al. |
| 2005/0173734 A1 | 8/2005 | Yoshioka et al. |
| 2006/0113536 A1 | 6/2006 | Kumomi et al. |
| 2006/0244107 A1 | 11/2006 | Sugihara et al. |

(Continued)

FOREIGN PATENT DOCUMENTS

CN  1941299  4/2007

(Continued)

OTHER PUBLICATIONS

Search Report issued in European Patent Application No. 09250845.6 on Jul. 2, 2009.

(Continued)

*Primary Examiner* — Cuong Q Nguyen
*Assistant Examiner* — Cathy N Lam
(74) *Attorney, Agent, or Firm* — H.C. Park & Associates, PLC (57) ABSTRACT

A thin film transistor (TFT) using an oxide semiconductor as an active layer, a method of manufacturing the TFT, and a flat panel display device having the TFT include a gate electrode formed on a substrate; an active layer made of an oxide semiconductor and insulated from the gate electrode by a gate insulating layer; source and drain electrodes coupled to the active layer; and an interfacial stability layer formed on one or both surfaces of the active layer. In the TFT, the interfacial stability layer is formed of an oxide having a band gap of 3.0 to 8.0 eV. Since the interfacial stability layer has the same characteristic as a gate insulating layer and a passivation layer, chemically high interface stability is maintained. Since the interfacial stability layer has a band gap equal to or greater than that of the active layer, charge trapping is physically prevented.

10 Claims, 10 Drawing Sheets

U.S. PATENT DOCUMENTS

| | | | |
|---|---|---|---|
| 2007/0069209 A1 | 3/2007 | Jeong et al. | |
| 2007/0072439 A1 | 3/2007 | Akimoto et al. | |
| 2008/0038882 A1 | 2/2008 | Takechi et al. | |
| 2010/0136743 A1* | 6/2010 | Akimoto et al. | 438/104 |
| 2011/0163311 A1 | 7/2011 | Akimoto et al. | |

FOREIGN PATENT DOCUMENTS

| | | |
|---|---|---|
| JP | 2003-086808 | 3/2003 |
| JP | 2004-273614 | 9/2004 |
| JP | 2007-073561 | 3/2007 |
| JP | 2007-096126 | 4/2007 |
| JP | 2008-141119 | 6/2008 |
| KR | 1998-65168 | 10/1998 |
| KR | 10-272260 | 8/2000 |
| KR | 2003-10122 | 2/2003 |
| KR | 2007-31090 | 3/2007 |
| KR | 2007-35373 | 3/2007 |
| KR | 2007-105925 | 10/2007 |
| KR | 2008-2414 | 1/2008 |
| WO | WO 2008/069056 | 6/2008 |
| WO | WO 2008/069286 | 6/2008 |

OTHER PUBLICATIONS

Office Action issued by Korean Intellectual Property Office in Korean Patent Application No. 10-2008-0062418 on Dec. 9, 2009.

Search Report issued by the European Patent Office in European Patent Application No. 09251688.9-1528 on Aug. 26, 2009.

U.S. Appl. No. 12/424,860, filed Apr. 16, 2009, Min-Kyu Kim et al., Samsung Mobile Display Co., Ltd.

Korean Office Action dated May 27, 2010, issued in corresponding Korean Patent Application No. 10-2008-0062418.

Office Action issued in Chinese Patent Application No. 200910138568.9 on Jul. 13, 2010.

Office Action dated May 10, 2011 issued by the European Patent Office for corresponding European Patent Application No. 09 250 845.6.

* cited by examiner

THIN FILM TRANSISTOR, METHOD OF MANUFACTURING THE SAME AND FLAT PANEL DISPLAY DEVICE HAVING THE SAME

CROSS-REFERENCE TO RELATED APPLICATIONS

This application claims priority to and the benefit of Korean Patent Application No. 2008-62418, filed on Jun. 30, 2008, in the Korean Intellectual Property Office, the entire content of which is incorporated herein by reference.

BACKGROUND OF THE INVENTION

1. Field of the Invention

Aspects of the present invention relate to a thin film transistor using an oxide semiconductor as an active layer, a method of manufacturing the same, and a flat panel display device having the same. More particularly, aspects of the present invention relate to a thin film transistor having an interfacial stability layer formed on one surface or both surfaces of an active layer, a method of manufacturing the same, and a flat panel display device having the same.

2. Description of the Related Art

In general, a thin film transistor (TFT) includes an active layer providing channel, source and drain regions, and a gate electrode formed on the channel region and electrically isolated from the active layer by a gate insulating layer.

The active layer of the TFT configured as described above is generally formed of a semiconductor material such as amorphous silicon or poly-silicon. However, if the active layer is formed of amorphous silicon, mobility is low, and therefore, it is difficult to operate a driving circuit at a high speed. If the active layer is formed of poly-silicon, mobility is high while a threshold voltage is not uniform. Therefore, a separate compensation circuit should be added.

Since a conventional method of manufacturing a TFT using low temperature poly-silicon (LTPS) involves a high-cost process, such as laser heat treatment, equipment investment and management costs are high, and it is difficult to apply the conventional method to a large-sized substrate.

In order to solve such a problem, studies on an oxide semiconductor used as an active layer have recently been conducted.

A TFT using a zinc oxide (ZnO) or oxide semiconductor having ZnO as a main component as an active layer has been disclosed in Japanese Laid-open Publication No. 2004-273614.

The oxide semiconductor having ZnO as a main component is estimated to be a stable material because of its amorphous state and high mobility. If such an oxide semiconductor is used as an active layer, a TFT can be manufactured using a conventional equipment without additionally purchasing separate processing equipment. The oxide semiconductor is deposited at a low temperature, and ion implantation is not required. Further, the oxide semiconductor is deposited using a sputtering method. Therefore, the oxide semiconductor can be applied to a large-sized substrate.

However, since a TFT using an oxide semiconductor as an active layer has electrical characteristics that are easily changed depending on structures of the TFT and processing conditions, reliability may be lowered. Particularly, when the TFT is driven by constant-voltage or constant-current, a threshold voltage is changed in a positive (+) direction depending on time. It is estimated that such a phenomenon is caused by charge trapping due to the deterioration of an interface between an active layer and an insulating layer, or an active layer and a passivation layer.

SUMMARY OF THE INVENTION

Accordingly, aspects of the present invention provide a thin film transistor (TFT) capable of improving interfacial characteristics of an active layer, a method of manufacturing the same, and a flat panel display device having the same.

Aspects of the present invention provide a TFT capable of preventing charge trapping in an interface of an active layer, a method of manufacturing the same, and a flat panel display device having the same.

Aspects of the present invention provide a TFT having high electrical characteristics and reliability, a method of manufacturing the TFT, and a flat panel display device having the same.

According to an aspect of the present invention, a TFT includes: a substrate; a gate electrode formed on the substrate; an active layer made of an oxide semiconductor and insulated from the gate electrode by a gate insulating layer; source and drain electrodes electrically coupled to the active layer; and an interfacial stability layer formed on any one of top and bottom surfaces of the active layer, wherein the interfacial stability layer is formed of an oxide having a band gap of 3.0 to 8.0 eV.

According to another aspect of the present invention, a method of manufacturing a TFT includes: forming a gate electrode on a substrate; forming a gate insulating layer on the substrate to cover the gate electrode; forming an interfacial stability layer and an oxide semiconductor layer on the gate insulating layer; patterning the oxide semiconductor layer, thereby forming an active layer; and forming source and drain electrodes electrically coupled to the active layer, wherein the interfacial stability layer is formed of an oxide having a band gap of 3.0 to 8.0 eV.

According to still another aspect of the present invention, a method of manufacturing a TFT includes: forming a gate electrode on a substrate; forming a gate insulating layer on the substrate having the gate electrode; forming an oxide semiconductor layer and an interfacial stability layer on the gate insulating layer; patterning the interfacial stability layer and the oxide semiconductor layer, thereby forming an active layer; and forming source and drain electrodes electrically coupled to the active layer, wherein the interfacial stability layer is formed of an oxide having a band gap of 3.0 to 8.0 eV.

According to still another aspect of the present invention, a flat panel display device having a TFT includes: a first substrate having a plurality of pixels, a plurality of TFTs, and a plurality of first electrodes formed thereon, the pixels being defined by a plurality of first and second conductive lines, the TFTs controlling signals supplied to the respective pixels, and the first electrodes being respectively electrically coupled to the TFTs; a second substrate having a second electrode formed thereon; and a liquid crystal layer injected into a space sealed between the first and second electrodes, wherein each of the TFTs includes: a gate electrode formed on the first substrate; an active layer made of an oxide semiconductor and isolated from the gate electrode by a gate insulating layer; source and drain electrodes electrically coupled to the active layer; and an interfacial stability layer formed on one or both of top and bottom surfaces of the active layer, wherein the interfacial stability layer has a band gap of 3.0 to 8.0 eV.

According to still another aspect of the present invention, a flat panel display device having a TFT includes: a first substrate having organic light emitting devices and TFTs formed thereon, the organic light emitting devices each including a first electrode, an organic thin film layer, and a second electrode, and the TFTs controlling operations of the respective organic light emitting devices; and a second substrate disposed opposite to the first substrate, wherein each of the TFTs includes: a gate electrode formed on the first substrate; an active layer made of an oxide semiconductor and isolated from the gate electrode by a gate insulating layer; source and drain electrodes electrically coupled to the active layer; and an interfacial stability layer formed on one or both of top and bottom surfaces of the active layer, wherein the interfacial stability layer is formed of an oxide having a band gap of 3.0 to 8.0 eV.

In a TFT according to aspects of the present invention, an interfacial stability layer is formed on one surface or both surfaces of an active layer. Since the interfacial stability layer containing an oxide has the same characteristic as a gate insulating layer and a passivation layer, chemically high interface stability is maintained. Since the interfacial stability layer has a band gap equal to or greater than that of the active layer, charge trapping is physically prevented. Accordingly, a change in electrical characteristics such as a change in threshold voltage is minimized by the high interface stability and electric charge mobility, and it is possible to prevent reliability from being lowered depending on temperature and time. When a TFT according to aspects of the present invention is applied to a flat panel display device, improved image quality can be implemented by stable electrical characteristics.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on," "formed on," or "disposed on" another element, it can be directly on, formed directly on, or disposed directly on the element or one or more intervening elements may be disposed therebetween. Also, when an element is referred to as being "connected to," "coupled to," or "electrically coupled to" another element, it can be directly connected to the element or be indirectly connected to the element with one or more intervening elements interposed therebetween. Hereinafter, like reference numerals refer to like elements.

Figure 1:
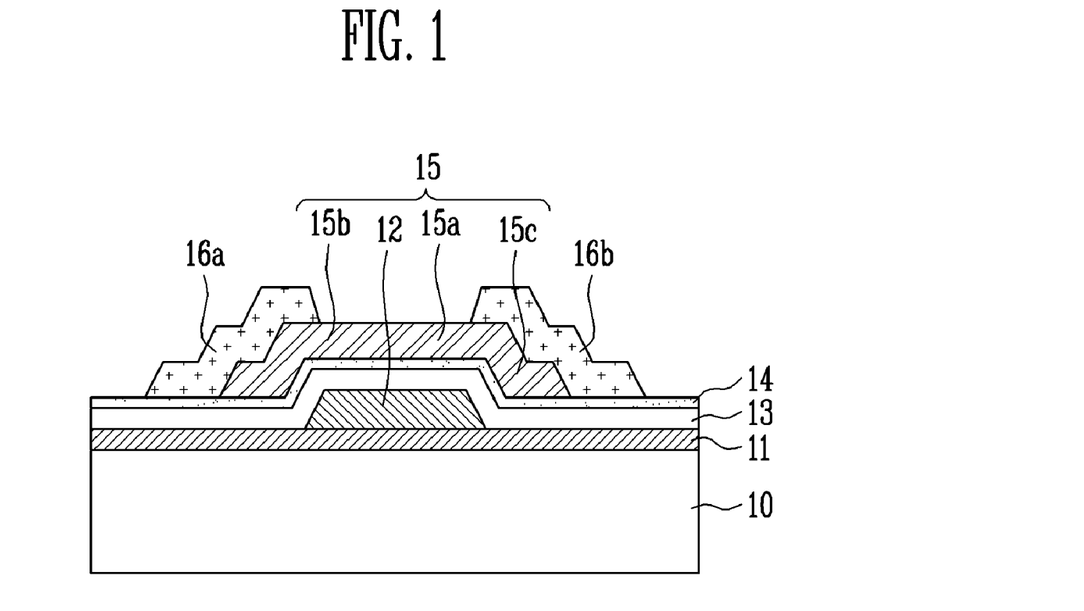
FIG. 1 is a cross-sectional view of a thin film transistor (TFT) according to an embodiment of the present invention.

FIG. 1 is a cross-sectional view of a thin film transistor (TFT) according to an embodiment of the present invention, in which an example of the TFT having a bottom-gate structure is illustrated. A buffer layer 11 is formed on a substrate 10, and a gate electrode 12 is formed on the buffer layer 11. A gate insulating layer 13 and an interfacial stability layer 14 are sequentially formed on the substrate 10 having the gate electrode 12, and an active layer 15 made of an oxide semiconductor is formed on the interfacial stability layer 14 having the gate electrode 12. Source and drain electrodes 16a and 16b are coupled respectively, to the active layer 15, on opposing sides thereof.

The interfacial stability layer 14 is an oxide having a band gap equal to or greater than that of the active layer 15, e.g., a band gap of 3.0 to 8.0 eV. The interfacial stability layer 14 may include any one selected from the group consisting of $SiO_x$, $SiN$, $SiO_xN_y$, $SiO_xC_y$, $SiO_xC_yH_z$, $SiO_xF_y$, $GeO_x$, $GdO_x$, $AlO_x$, $GaO_x$, $SbO$, $ZrO_x$, $HfO_x$, $TaO_x$, $YO_x$, $VO_x$, $MgO_x$, $CaO_x$, $BaO_x$, $SrO_x$, and spin on glass (SOG).

The active layer 15 includes a channel region 15a, a source region 15b, and a drain region 15c. In the active layer 15, the channel region 15a is disposed to overlap with the gate electrode 12. The active layer 15 may contain zinc oxide (ZnO) and be doped with at least one ion of gallium (Ga), indium (In), tin (Sn), zirconium (Zr), hafnium (Hf), cadmium (Cd), silver (Ag), copper (Cu), germanium (Ge), gadolinium (Gd), and vanadium (V). Further, the active layer 15 may be formed of ZnO, ZnGaO, ZnInO, ZnSnO, GaInZnO, CdO, InO, GaO, SnO, AgO, CuO, GeO, GdO, HfO, or the like.

Figure 2:
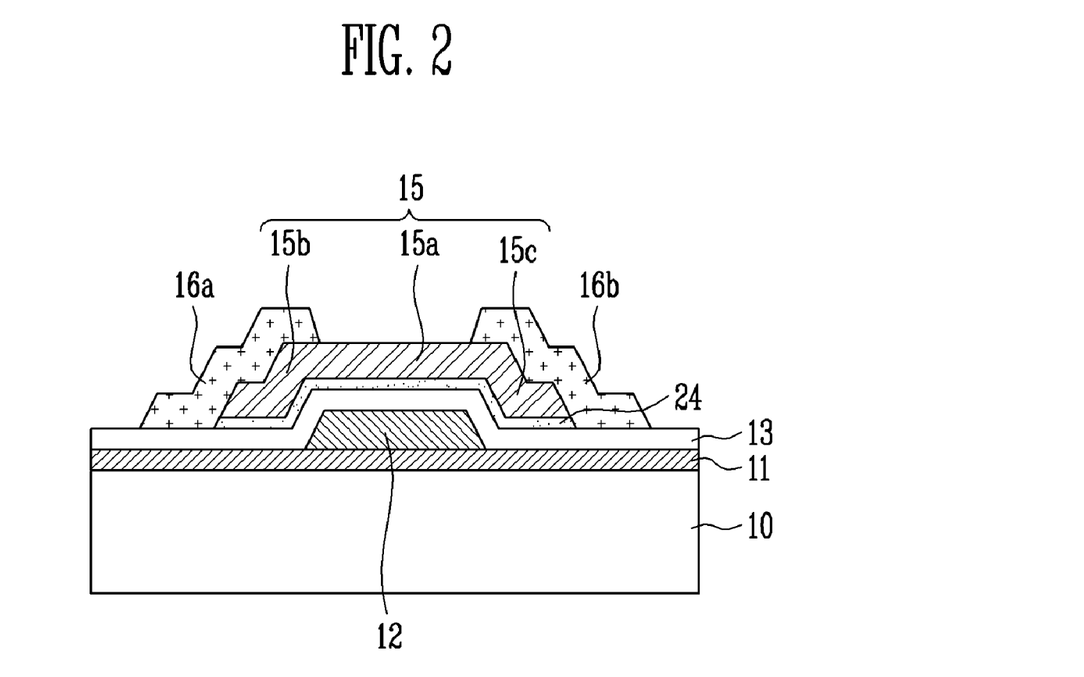
FIG. 2 is a cross-sectional view of a TFT according to an embodiment of the present invention.

FIG. 2 is a cross-sectional view of a TFT according to an embodiment of the present invention. Only differences from the structure shown in FIG. 1 will be described.

The TFT of FIG. 1 has a structure in which the interfacial stability layer 14 is formed wider than the active layer 15. On the other hand, the TFT of FIG. 2 has a structure in which an interfacial stability layer 24 is formed to the same size as that of an active layer 15. At this time, the interfacial stability layer 24 and the active layer 15 are simultaneously patterned so that sidewalls of the interfacial stability layer 24 and the active layer 15 correspond to each other. Therefore, the number of processes can be decreased.

Figure 3:
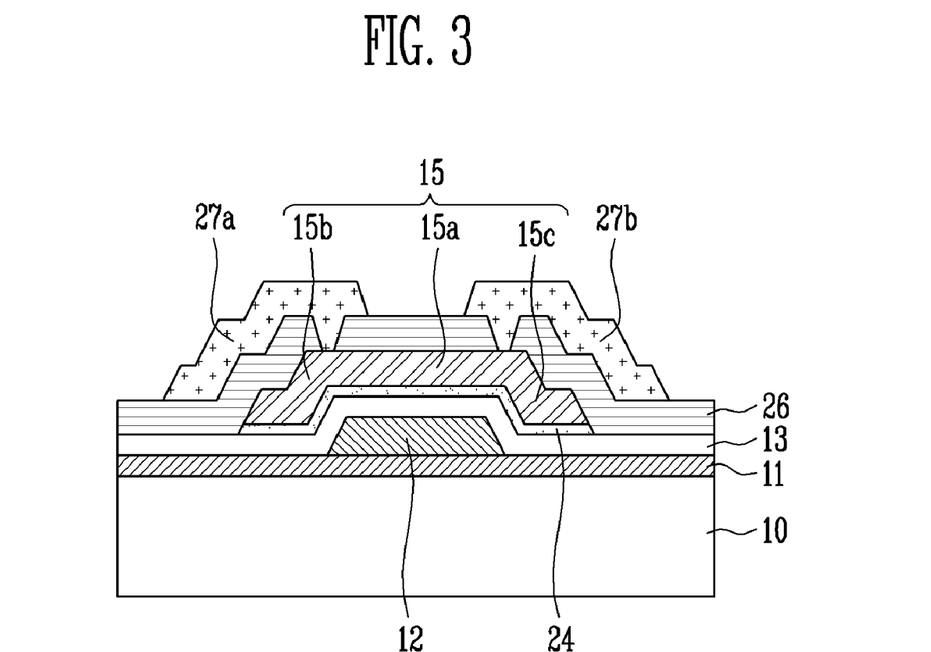
FIG. 3 is a cross-sectional view of a TFT according to an embodiment of the present invention.

FIG. 3 is a cross-sectional view of a TFT according to an embodiment of the present invention. Only differences from the structures shown in FIGS. 1 and 2 will be described in the following.

The TFT of FIG. 1 or 2 has a structure in which the source and drain electrodes 16a and 16b are directly in contact with the active layer 15. On the other hand, the TFT of FIG. 3 has a structure in which a passivation layer 26 is formed on a substrate 10 having an active layer 15 and interfacial stability layer 24. Although shown as including the interfacial stability layer 24, the TFT of FIG. 3 may include the interfacial stability layer 14 of FIG. 1. Source and drain electrodes 27a and 27b are coupled to the active layer 15 through contact holes formed in the passivation layer 26. The passivation layer 26 may be formed of an oxide including a material selected from the group consisting of zinc (Zn), gallium (Ga), indium (In), tin (Sn), zirconium (Zr), hafnium (Hf), cadmium (Cd), silver (Ag), copper (Cu), germanium (Ge), gadolinium (Gd), vanadium (V), silicon (Si), and aluminum (Al).

The passivation layer 26 formed of an oxide may protect a channel region 15a of the active layer 15 and be used as an etch stop layer in an etching process of forming the source and drain electrodes 27a and 27b. For this reason, it is possible to prevent the active layer 15 from being damaged by plasma or acids used in the etching process.

An oxide semiconductor is easily damaged by plasma or easily etched by acid or the like. Therefore, in a structure without a passivation layer 26, the oxide semiconductor may be damaged by plasma when a thin film is formed on the active layer 15 or when the formed thin film is etched. Further, carriers are increased due to a bombardment effect, a radiation effect, or the like, thereby changing electrical characteristics of the active layer 15. Electrical characteristics of a TFT may be lowered due to the change in electrical characteristics of the active layer 15, and characteristic dispersion in a substrate may be lowered.

Figure 4:
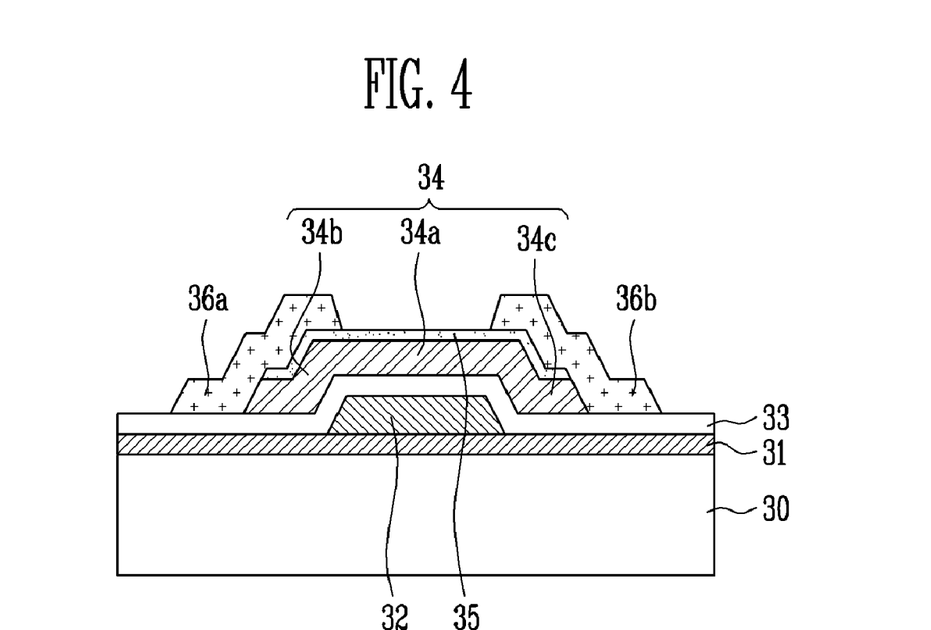
FIG. 4 is a cross-sectional view of a TFT according to an embodiment of the present invention.

FIG. 4 is a cross-sectional view of a TFT according to an embodiment of the present invention. The TFT of FIG. 1 to 3 has a structure in which the interfacial stability layer 14 or 24 is formed beneath a bottom surface of the active layer 15, i.e., closer to the substrate 10. On the other hand, the TFT of FIG. 4 has a structure in which an interfacial stability layer 35 is formed on a top surface of an active layer 34, i.e., opposite the active layer 34 from a substrate 30.

Referring to FIG. 4, a buffer layer 31 is formed on a substrate 30, and a gate electrode 32 is formed on the buffer layer 31. A gate insulating layer 33 is formed on the substrate 30 having the gate electrode 32, and an active layer 34 made of an oxide semiconductor is formed on the gate insulating layer 33 corresponding to the gate electrode 32. An interfacial stability layer 35 is formed on the active layer 34, and source and drain electrodes 36a and 36b are coupled to the interfacial stability layer 35 and the active layer 34.

The active layer 34 provides a channel region 34a, a source region 34b, and a drain region 34c. In the active layer 34, the channel region 34a is disposed to overlap with the gate electrode 32. The active layer 34 may contain zinc oxide (ZnO) and be doped with at least one ion of gallium (Ga), indium (In), tin (Sn), zirconium (Zr), hafnium (Hf), cadmium (Cd), silver (Ag), copper (Cu), germanium (Ge), gadolinium (Gd), and vanadium (V).

The interfacial stability layer 35 is an oxide having a band gap equal to or greater than that of the active layer 34, e.g., a band gap of 3.0 to 8.0 eV. The interfacial stability layer 35 may include any one selected from the group consisting of $SiO_x$, SiN, $SiO_xN_y$, $SiO_xC_y$, $SiO_xC_yH_z$, $SiO_xF_y$, $GeO_x$, $GdO_x$, $AlO_x$, $GaO_x$, SbO, $ZrO_x$, $HfO_x$, $TaO_x$, $YO_x$, $VO_x$, $MgO_x$, $CaO_x$, $BaO_x$, $SrO_x$, and SOG. Preferably, the interfacial stability layer 35 disposed between the active layer 34 and the source and drain electrodes 36a and 36b is formed to have, for example, a thickness of 10 to 20 Å, so that contact resistance between the active layer 34 and the source and drain electrodes 36a and 36b can be low. Further, interfacial stability layer 35 and the active layer 34 may be simultaneously patterned.

Figure 5:
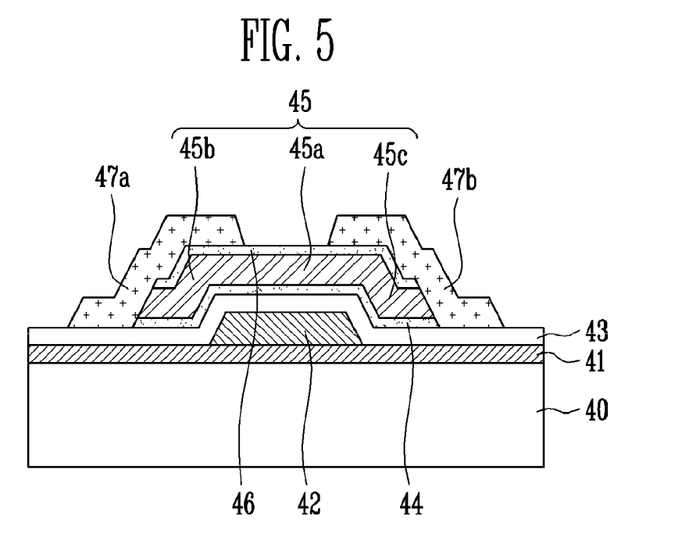
FIG. 5 is a cross-sectional view of a TFT according to an embodiment of the present invention.

FIG. 5 is a cross-sectional view of a TFT according to an embodiment of the present invention. The TFT of FIG. 1 to 3 has a structure in which the interfacial stability layer 14 or 24 is formed beneath a bottom surface of the active layer 15, and the TFT of FIG. 4 has a structure in which the interfacial stability layer 35 is formed on the top surface of the active layer 34. The TFT of FIG. 5 has a structure in which first and second interfacial stability layers 44 and 46 are formed on bottom and top surfaces of an active layer 45, respectively, i.e., the first and second interfacial stability layers 44 and 46 are formed on opposite sides of an active layer 45.

Referring to FIG. 5, a buffer layer 41 is formed on a substrate 40, and a gate electrode 42 is formed on the buffer layer 41. A gate insulating layer 43 is formed on the substrate 40 having the gate electrode 42, and an active layer 45 made of an oxide semiconductor is formed on the gate insulating layer 43 corresponding to the gate electrode 42. At this time, the first and second interfacial stability layers 44 and 46 are formed on bottom and top surfaces of the active layer 45, respectively, and source and drain electrodes 47a and 47b are coupled to the first and second interfacial stability layers 44 and 46 and the active layer 45.

The active layer 45 provides a channel region 45a, a source region 45b, and a drain region 45c. In the active layer 45, the channel region 45a is disposed to overlap with the gate electrode 42. The oxide semiconductor constituting the active layer 45 may contain zinc oxide (ZnO) and be doped with at least one ion of gallium (Ga), indium (In), tin (Sn), zirconium (Zr), hafnium (Hf), cadmium (Cd), silver (Ag), copper (Cu), germanium (Ge), gadolinium (Gd) and vanadium (V).

Each of the first and second interfacial stability layers 44 and 46 is an oxide having a band gap equal to or greater than that of the active layer 45, e.g., a band gap of 3.0 to 8.0 eV. Each of the first and second interfacial stability layers 44 and 46 may include any one selected from the group consisting of $SiO_x$, SiN, $SiO_xN_y$, $SiO_xC_y$, $SiO_xC_yH_z$, $SiO_xF_y$, $GeO_x$, $GdO_x$, $AlO_x$, $GaO_x$, SbO, $ZrO_x$, $HfO_x$, $TaO_x$, $YO_x$, $VO_x$, $MgO_x$, $CaO_x$, $BaO_x$, $SrO_x$, and SOG. Preferably, the first interfacial stability layer 44 formed on the bottom surface of the active layer 45 is formed to have, for example, a thickness of 50 to 5000 Å so as to sufficiently protect the active layer 45 and to maintain interface stability. Preferably, the second interfacial stability layer 46 formed on the top surface of the active layer 45 is formed to have a thickness of below 100 Å so that contact resistance between the active layer 45 and the source and drain electrodes 47a and 47b can be low. More preferably the interfacial stability layer 46 is formed to have a thickness of 10 to 20 Å.

In the TFT of FIGS. 4 and 5, the interfacial stability layer 35 and the second interfacial stability layer 46 may protect the channel region 34a or 45a of the active layer 34 or 45 and be used as an etch stop layer in an etching process of forming the source and drain electrodes 36a and 36b or 47a and 47b. For this reason, it is possible to prevent the active layer 34 or 45 from being damaged by plasma or the like.

Hereinafter, a method of manufacturing a TFT configured as described above according to aspects of the present invention will be described in detail with reference to FIGS. 6A to 6D. The structure of FIG. 5 will be described as an example.

Figure 6A:
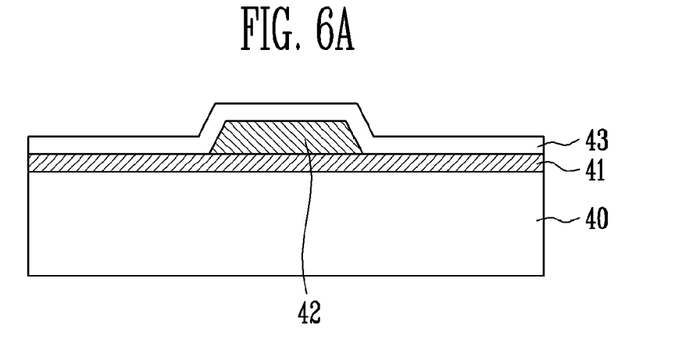
FIGS. 6A to 6D are cross-sectional views illustrating a method of manufacturing a TFT according to aspects of the present invention.

Referring to FIG. 6A, a gate electrode 42 is formed on a substrate 40, and a gate insulating layer 43 is then formed on the substrate 40 having the gate electrode 42. A buffer layer 41 may be formed on the substrate 40 so as to prevent diffusion of impurities, and the gate electrode 42 may be formed on the buffer layer 41. The substrate 40 may include a semiconductor substrate, such as silicon (Si); an insulative substrate, such as glass or plastic; or a metal substrate. The gate electrode 42 is formed of a metal, such as Al, Cr, or MoW, and the gate insulating layer 43 is formed of an insulating material, such as $SiO_2$, $SiN_x$, or $GaO_3$.

Figure 6B:
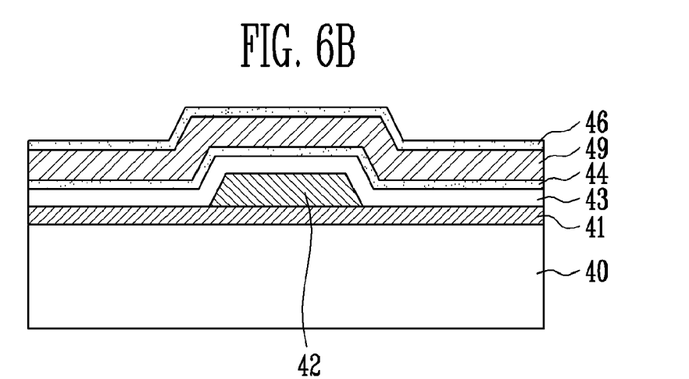

Referring to FIG. 6B, a first interfacial stability layer 44, an oxide semiconductor layer 49, and a second interfacial stability layer 46 are sequentially formed on the gate insulating layer 43. Each of the first and second interfacial stability layers 44 and 46 is an oxide having a band gap equal to or greater than that of the resultant active layer 45, e.g., a band gap of 3.0 to 8.0 eV. Each of the first and second interfacial stability layers 44 and 46 may include any one selected from the group consisting of $SiO_x$, SiN, $SiO_xN_y$, $SiO_xC_y$, $SiO_x$-$C_yH_z$, $SiO_xF_y$, $GeO_x$, $GdO_x$, $AlO_x$, $GaO_x$, SbO, $ZrO_x$, $HfO_x$, $TaO_x$, $YO_x$, $VO_x$, $MgO_x$, $CaO_x$, $BaO_x$, $SrO_x$, and SOG.

A silicon oxide ($SiO_x$) or aluminum oxide ($AlO_x$) may be deposited using a physical method such as a radio frequency (RF) or direct current (DC) sputtering deposition method. When an aluminum oxide ($AlO_x$) is deposited using the RF sputtering deposition method, an oxygen ratio is adjusted to be 4 to 10%, thereby obtaining the first and second interfacial stability layers 44 and 46 having an excellent resistance to stress, such as due to temperature and/or a gate bias.

Figure 6C:
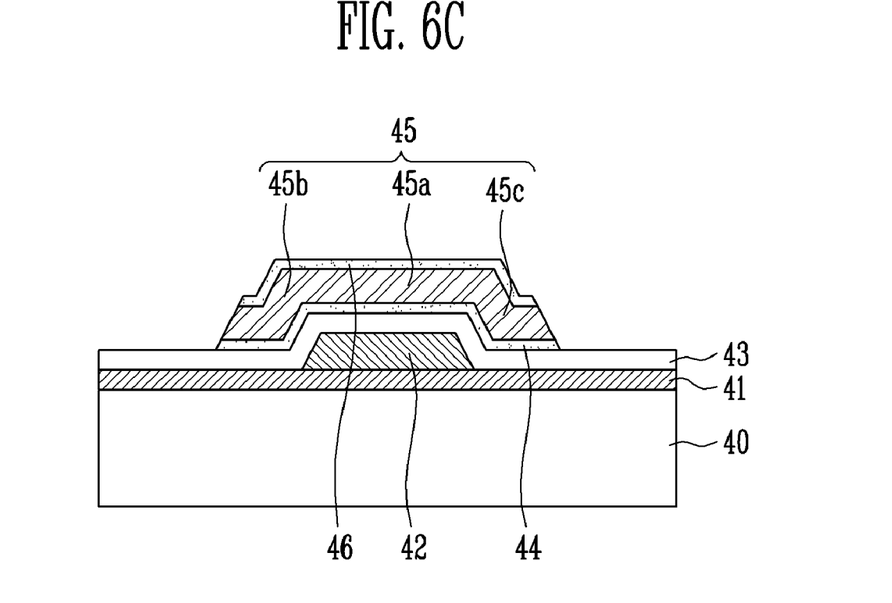

Referring to FIG. 6C, the second interfacial stability layer 46, the oxide semiconductor layer 49, and the first interfacial stability layer 44 are sequentially patterned, thereby forming the active layer 45 made of an oxide semiconductor between the first and second interfacial stability layers 44 and 46. Aspects of the present invention further provide that the second interfacial stability layer 46, the oxide semiconductor layer 45, and the first interfacial stability layer 44 may be simultaneously patterned. At this time, the first interfacial stability layer 44 formed beneath a bottom surface of the oxide semiconductor layer 45 may not be patterned as shown in FIG. 1. Further, the second interfacial stability layer 46 need not be included as shown in FIGS. 1 and 2.

Figure 6D:
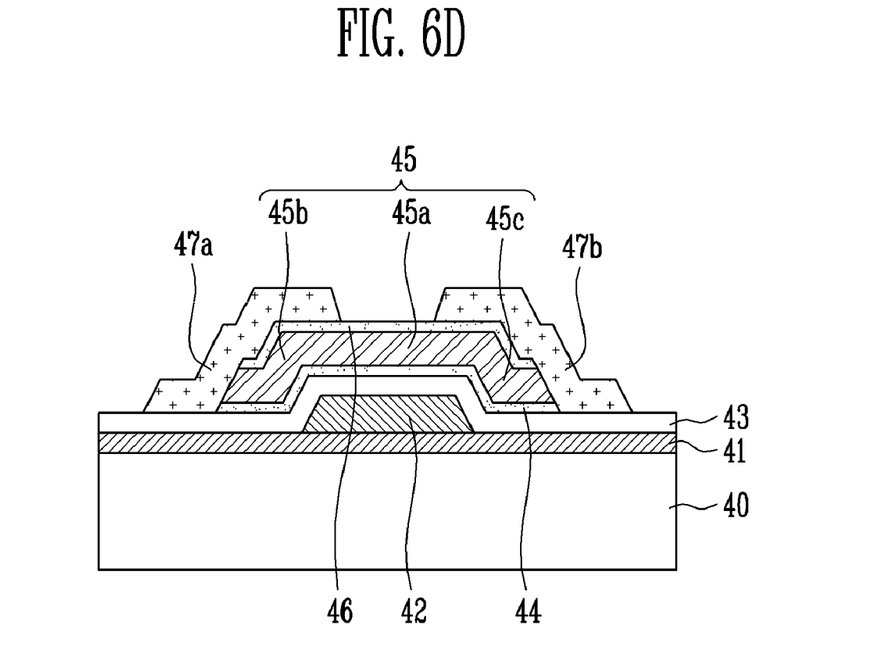

Referring to FIG. 6D, source and drain electrodes 47a and 47b coupled to the interfacial stability layer 46 and the active layer 45 are formed by forming a conductive layer on an entire surface of the substrate 40 using Mo, MoW, Al, AlNd, AlLiLa, or the like, and then patterning the conductive layer. At this time, as shown in FIG. 3, source and drain electrodes 47a and 47b may be formed by forming a passivation layer on a substrate 40 having an active layer 45, forming contact holes in the passivation layer to expose the active layer 45, forming a conductive layer on the passivation layer to fill the contact holes, and then patterning the conductive layer.

As described above, in a TFT according to aspects of the present invention, an interfacial stability layer is formed on one surface or both surfaces of an active layer. The interfacial stability layer is made of an oxide having a band gap of 3.0 to 8.0 eV. If the band gap of the interfacial stability layer is smaller than a band gap of the active layer, e.g., 3.0 eV, electric charges are easily transferred, and therefore, carriers of a channel cannot be effectively used. If the band gap of the interfacial stability layer is greater than 8.0 eV, electrical characteristics are lowered due to a high insulation characteristic. Since the interfacial stability layer containing an oxide has the same characteristic as the gate insulating layer and the passivation layer, chemically high interface stability is maintained. Further, since the interfacial stability layer has a band gap equal to or greater than that of the active layer, charge trapping is physically prevented.

In order to increase an effect of preventing charge trapping, the effect [H], [OH⁻] concentration of the interfacial stability layer is preferably adjusted to be less than $10^{19}/cm^3$. If the net electron concentration of the interfacial stability layer from the remnant [H], [OH⁻] is higher than $10^{19}/cm^3$, hydrogen or hydroxyl atom/molecule/ion is penetrated (diffused) through a surface of the active layer to serve as a trap. For this reason, electrical characteristics of the active layer may be lowered. In order to adjust the [H] or [OH⁻] concentration of the interfacial stability layer to be $10^{+19}/cm^3$ or lower, a physical deposition method, such as a sputtering deposition method, may be used rather than a chemical deposition method.

The interfacial stability layer according to aspects of the present invention also increases a curing effect in a subsequent heat treatment process, thereby preventing damage of the active layer.

Figure 7A:
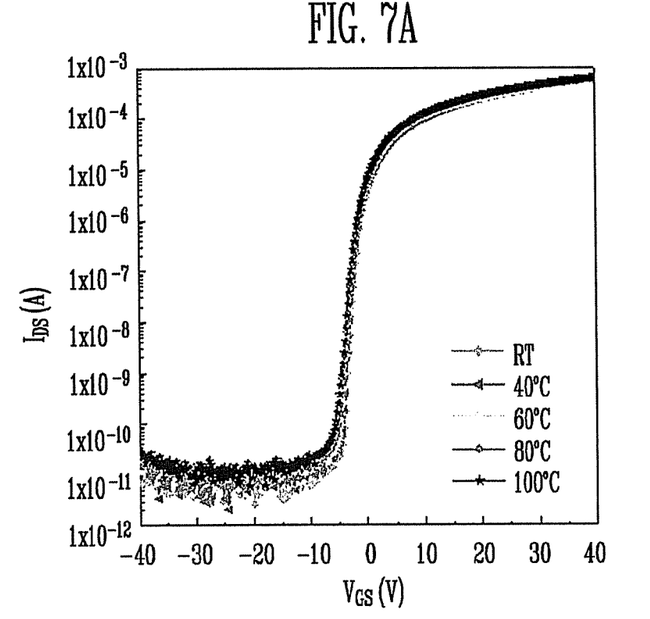
FIGS. 7A and 7B are graphs showing reliability measurement results of a TFT according to aspects of the present invention.
Figure 7B:
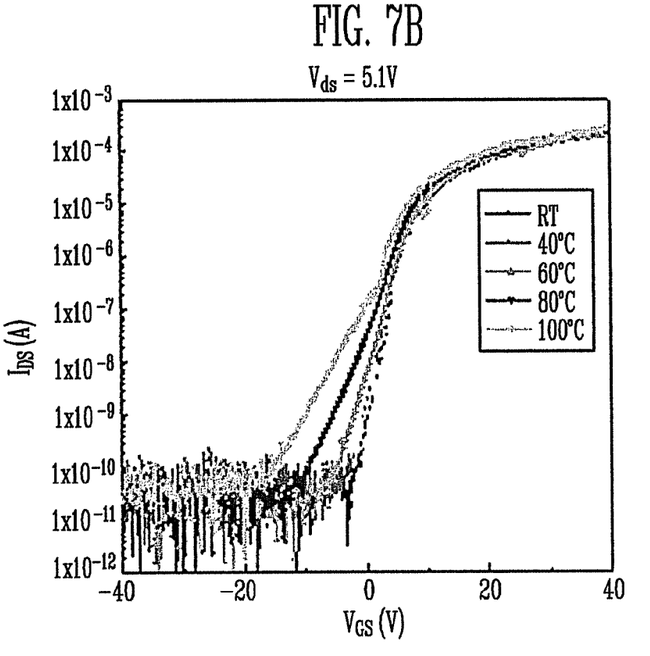

FIG. 7A is a graph showing reliability measurement results of a TFT according to aspects of the present invention in which an interfacial stability layer is formed by depositing an aluminum oxide ($AlO_x$) using a physical method. Since a threshold voltage (Vth), an S-factor (Sub-threshold slope-factor), and an off-current were negligibly changed after a temperature was increased from a room temperature to 100° C., the TFT has an excellent reliability. FIG. 7B is a graph showing reliability measurement results of a TFT according to aspects of the present invention in which an interfacial stability layer is formed by depositing a silicon oxide ($SiO_x$) using a plasma enhanced chemical vapor deposition (PECVD). As a temperature increased, a threshold voltage (Vth) was changed in a negative direction, and a slop-factor was degraded.

Figure 8A:
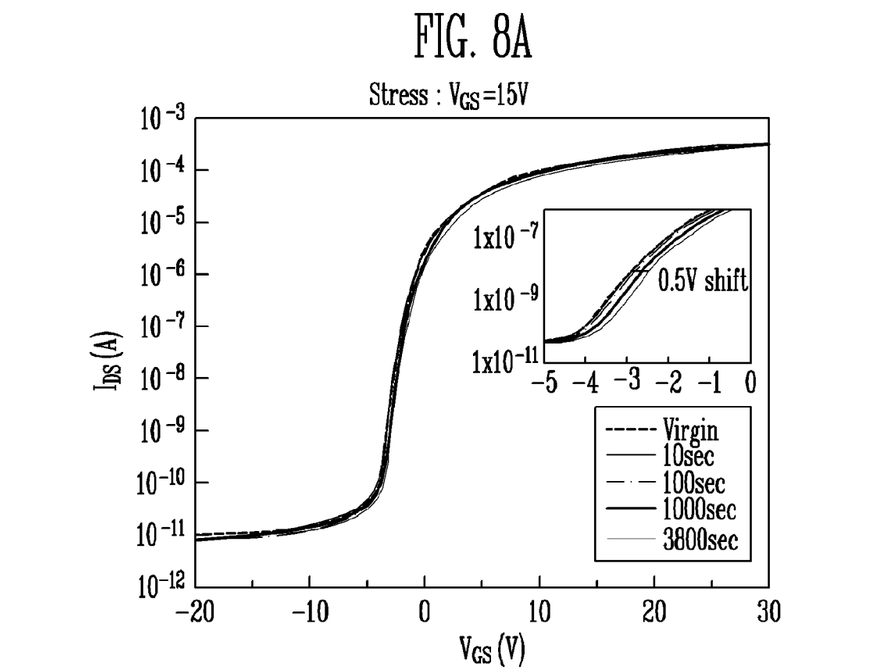
FIGS. 8A to 8C are graphs showing stress measurement results of a TFT according to aspects of the present invention.
Figure 8B:
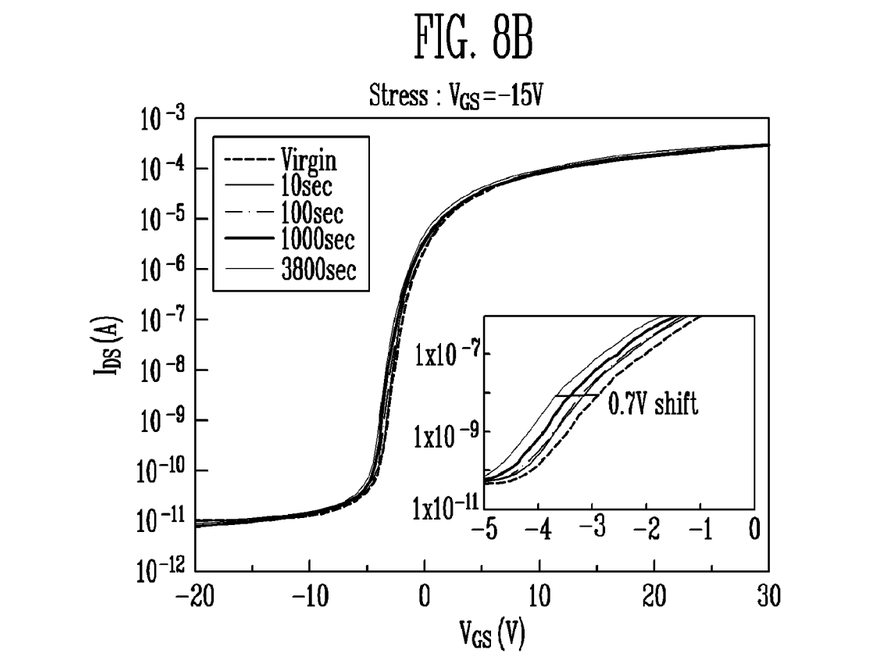

FIGS. 8A and 8B are graphs showing stress measurement results of a TFT according to aspects of the present invention. In FIG. 8A, a voltage $V_{GS}$ of 15V was applied to a gate electrode for 1 hour, and in FIG. 8B, a voltage $V_{GS}$ of −15V was applied to the gate electrode for 1 hour. In FIG. 8A, the change in threshold voltage (Vth) was 0.5V, and in FIG. 8B, the change in threshold voltage (Vth) was 0.7V.

Figure 8C:
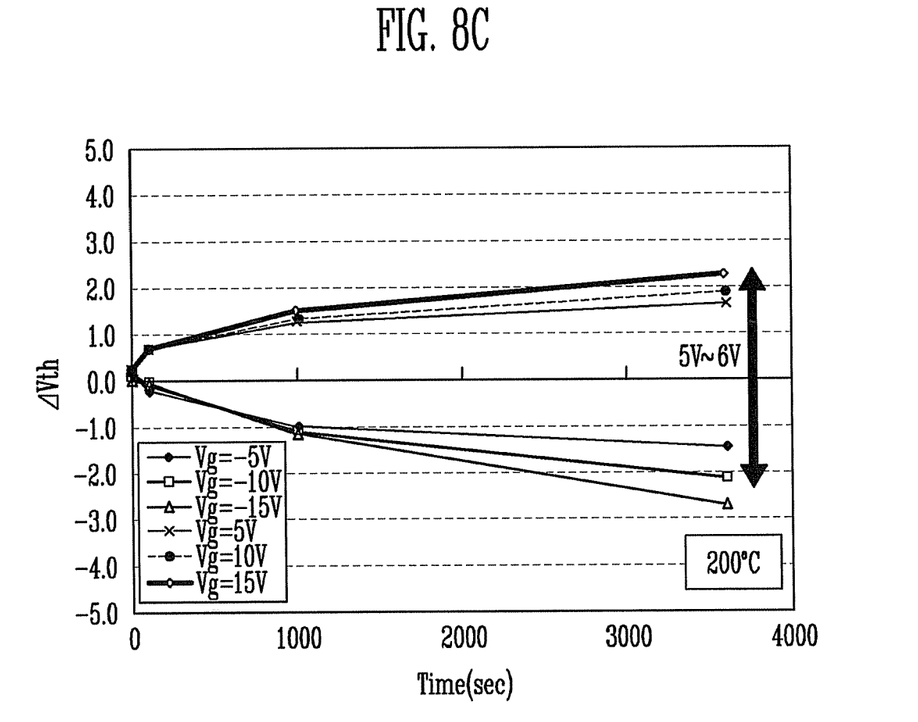

FIG. 8C is a graph showing stress measurement results of a TFT according to aspects of the present invention in which an interfacial stability layer is formed using a silicon oxide ($SiO_x$). The silicon oxide ($SiO_x$) is generally used in manufacturing a poly-silicon TFT, and a thermal oxide ($SiO_2$) formed at a temperature of 900° C. using a dry ($O_2$) or wet ($H_2O$) thermal oxidation method as the silicon oxide ($SiO_x$). When a voltage $V_{GS}$ of 15V was applied to a gate electrode for 1 hour, the change in threshold voltage (Vth) was 2.1V, and when a voltage $V_{GS}$ of −15V was applied to the gate electrode for 1 hour, the change in threshold voltage (Vth) was −2.8V. Therefore, it can be seen that reliability of the TFT is remarkably improved as compared with the conventional TFT through the results of FIGS. 8A and 8B.

Figure 9:
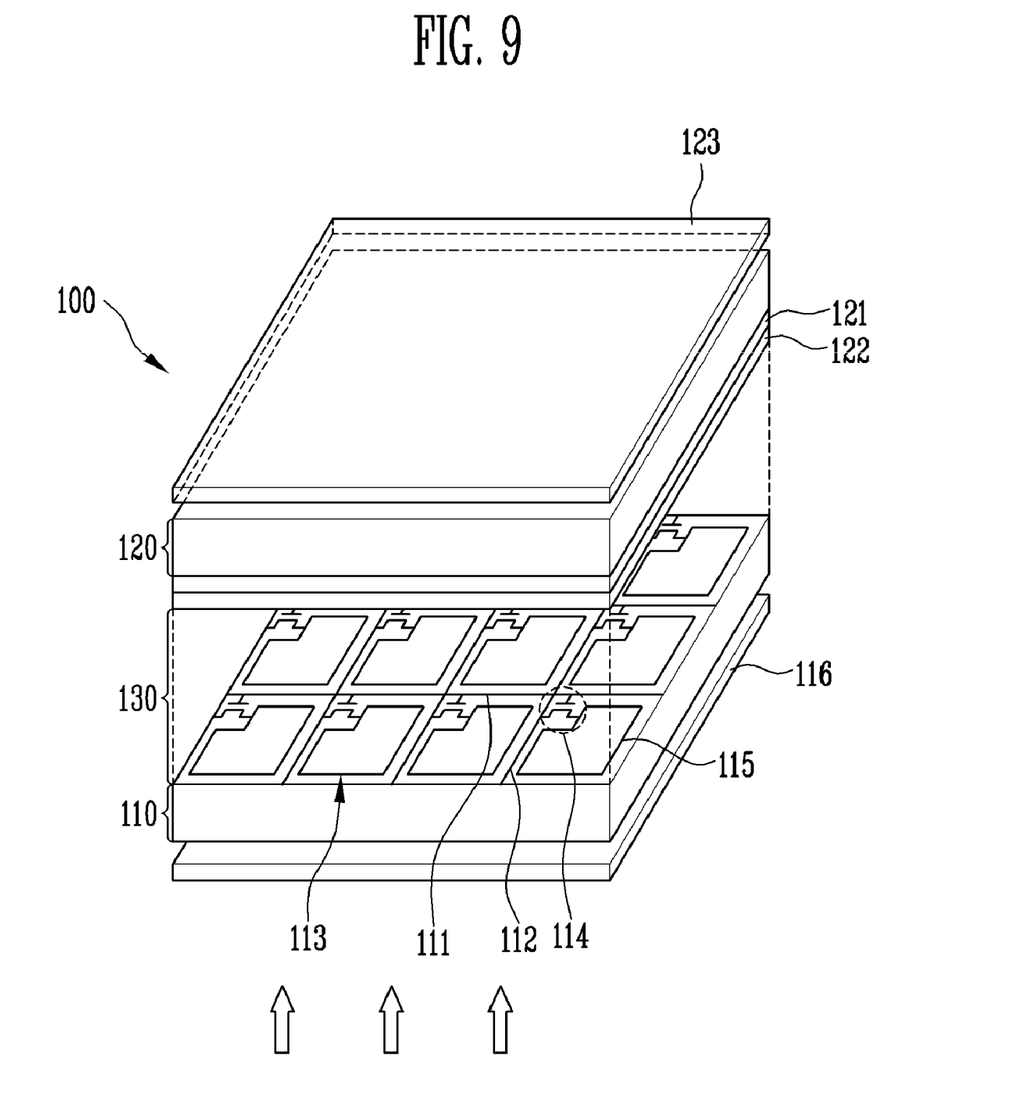
FIG. 9 is a perspective view showing an embodiment of a flat panel display device having a TFT according to aspects of the present invention.

A TFT according to aspects of the present invention may be applied to a flat panel display device. FIG. 9 is a perspective view showing an embodiment of a flat panel display device having a TFT according to aspects of the present invention. A display panel 100 displaying images will be schematically described.

The display panel 100 includes two substrates 110 and 120 disposed opposite to each other, and a liquid crystal layer 130 disposed between the two substrates 110 and 120. In the display panel 100, pixel regions 113 are defined by a plurality of gate and data lines 111 and 112 and are arranged in a matrix form.

A TFT 114 controls a signal supplied to each pixel and a pixel electrode 115 coupled to the transistor 114 is formed at each of the intersection portions of the gate and data lines 111 and 112 on the substrate 110. The TFT 114 has any one of the structures of FIGS. 1 to 5, and may be manufactured using the method of manufacturing a TFT, described with reference to FIGS. 6A to 6D.

A color filter 121 and a common electrode 122 are formed on the substrate 120. Polarizing plates 116 and 123 are formed at rear surfaces of the substrates 110 and 120, respectively, and a backlight (not shown) is disposed below a polarizing plate 116.

Meanwhile, a liquid crystal display (LCD) drive IC (not shown) driving the display panel 100 is mounted at a side of the pixel regions 113 of the display panel 100. The LCD drive IC converts electric signals provided from the outside of the display panel 100 into scan and data signals, and then supplies the converted scan and data signals to the gate and data lines 111 and 112.

Figure 10A:
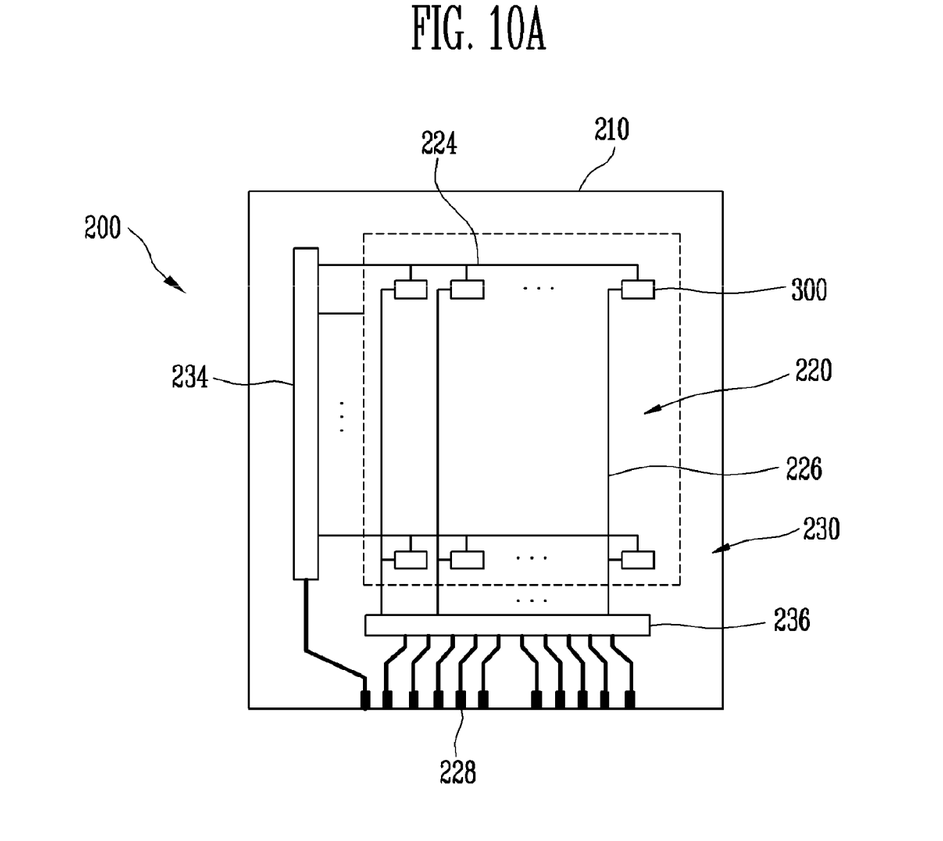
FIGS. 10A and 10B are respectively plan and cross-sectional views showing another embodiment of a flat panel display device having a TFT according to aspects of the present invention.
Figure 10B:
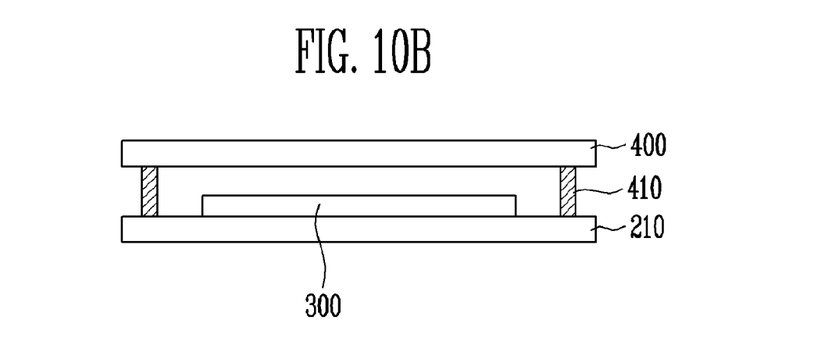

FIGS. 10A and 10B are respectively plan and cross-sectional views showing another embodiment of a flat panel display device having a TFT according to aspects of the present invention. A display panel 200 displaying images will be schematically described.

Referring to FIG. 10A, a substrate 210 is divided into a pixel region 220 and a non-pixel region 230 surrounding the pixel region 220. A plurality of organic light emitting devices 300 connected in a matrix form between scan and data lines 224 and 226 are formed on the substrate 210 of the pixel region 220. On the substrate 210 of the non-pixel region 230 are formed the scan and data lines 224 and 226 extended from the pixel region 220, a power supply line (not shown) operates the organic light emitting devices 300, and scan and data drivers 234 and 236, respectively, supply signals provided from the outside of the display panel 200 to the scan and data lines 224 and 226.

Figure 11:
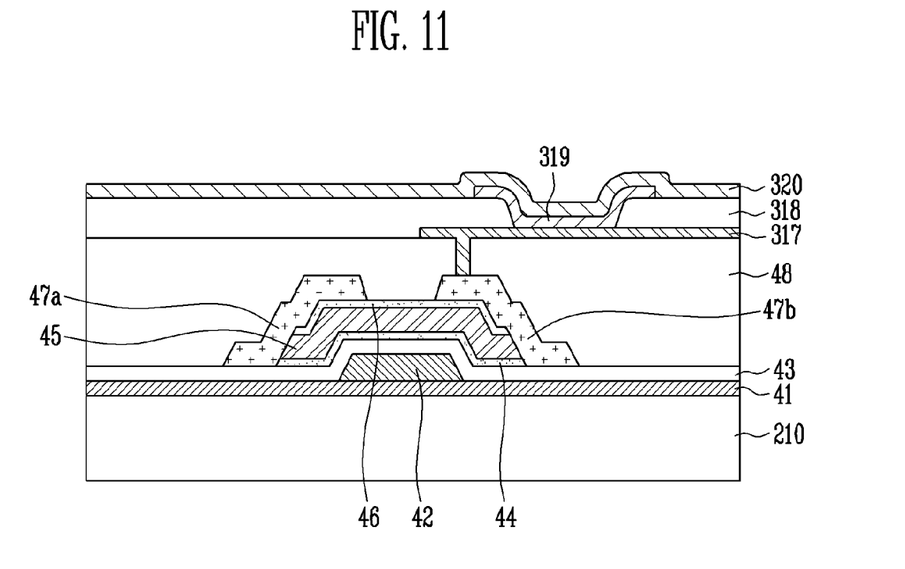
FIG. 11 is a cross-section view of an organic light emitting device of FIG. 10A.

Referring to FIG. 11, the organic light emitting device 300 includes an anode electrode 317, a cathode electrode 320, and an organic thin film layer 319 formed between the anode and cathode electrodes 317 and 320. The organic thin film layer 319 is formed to have a structure in which a hole transfer layer, an organic light emitting layer, and an electron transfer layer are laminated. A hole injection layer, a hole blocking layer, an electron blocking layer, and an electron injection layer may be further included in the organic thin film layer 319. The organic light emitting device 300 may further include a TFT to control an operation of the organic light emitting device 300 and a capacitor to maintain signals.

The TFT may have any one of the structures of FIGS. 1 to 5, and may be manufactured using the method of manufacturing a TFT, described with reference to FIGS. 6A to 6D. Hereinafter, the organic light emitting device 300 including a TFT will be described in detail with reference to FIGS. 10A and 11.

A buffer layer 41 is formed on the substrate 210, and a gate electrode 42 is formed on the buffer layer 41 of the pixel region 220. At this time, a scan line 224 coupled to the gate electrode 42 is formed in the pixel region 220. The scan line 224 is connected to the gate electrode 42 of the organic light emitting device 300. The scan line 224 may extend from the pixel region 220 and a pad 228 to receive signals provided from the outside of the display panel 300, and may be formed in the non-pixel region 230.

A gate insulating layer 43 is formed on the substrate 210 having the gate electrode 42, and an active layer 45 made of an oxide semiconductor is formed on the gate insulating layer 43 corresponding to the gate electrode 42. Interfacial stability layers 44 and 46 are formed on bottom and top surfaces of the active layer 45, respectively.

Source and drain electrodes 47a and 47b are formed at both sides of the active layer 45, respectively. At this time, a data line 226 coupled to one of the source and drain electrodes 47a and 47b is formed in the pixel region 220. The data line 226 may extend from the pixel region 220 to receive signals provided from the outside of the display panel 200, and may be formed in the non-pixel region 230.

A planarization layer 48 is formed above the TFT configured as described above, and a via hole is formed in the planarization layer 48 so that the source or drain electrode 47a or 47b is exposed. The anode electrode 317 is formed to be coupled to the source or drain electrode 47a or 47b through the via hole.

A pixel defining layer 318 is formed on the planarization layer 48 so that a region (a light emitting region) of the anode electrode 317 is exposed, and the organic thin film layer 319 is formed on the exposed anode electrode 317. The cathode electrode 320 is formed on the pixel defining layer 318 having the organic thin film layer 319.

Referring to FIG. 10B, a sealing substrate 400 sealing the pixel region 220 is disposed above the substrate 210 having the organic light emitting device 300, and the sealing substrate 400 is joined with the substrate 210 by a sealing member 410, thereby completing the display panel 200.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film transistor (TFT), comprising:
   a substrate;
   a gate electrode formed on the substrate;
   a gate insulating layer formed on the substrate to cover the gate electrode;
   an active layer formed of an oxide semiconductor and insulated from the gate electrode by the gate insulating layer;
   source and drain electrodes electrically coupled to the active layer; and
   an interfacial stability layer formed on at least one of top and bottom surfaces of the active layer, the interfacial stability layer being formed of an oxide having a band gap of 3.0 to 8.0 eV,
   wherein the interfacial stability layer directly contacts at least one of an entire top surface and an entire bottom surface of the active layer.

2. The TFT of claim 1, wherein the oxide semiconductor comprises zinc oxide (ZnO).

3. The TFT of claim 2, wherein the oxide semiconductor is doped with at least one ion of gallium (Ga), indium (In), tin (Sn), zirconium (Zr), hafnium (Hf), cadmium (Cd), silver (Ag), copper (Cu), germanium (Ge), gadolinium (Gd), and vanadium (V).

4. The TFT of claim 1, further comprising:
   a passivation layer formed on the substrate to cover the active layer, the passivation layer having contact holes formed therein so as to expose the active layer,
   wherein the source and drain electrodes are electrically coupled to the active layer through the contact holes.

5. The TFT of claim 1, wherein sidewalls of the interfacial stability layer and the active layer correspond to each other.

6. The TFT of claim 1, wherein the interfacial stability layer is formed wider than the active layer when the interfacial stability layer is formed at the bottom surface of the active layer.

7. The TFT of claim 1, wherein the interfacial stability layer comprises one selected from the group consisting of $SiO_x$, SiN, $SiO_xN_y$, $SiO_xC_y$, $SiO_xC_yH_z$, $SiO_xF_y$, $GeO_x$, $GdO_x$, $AlO_x$, $GaO_x$, SbO, $ZrO_x$, $HfO_x$, $TaO_x$, $YO_x$, $VO_x$, $MgO_x$, $CaO_x$, $BaO_x$, $SrO_x$, and spin on glass (SOG).

8. The TFT of claim 1, wherein an oxygen concentration of the interfacial stability layer is $10^{19}/cm^3$ or lower.

9. A thin film transistor (TFT), comprising:
 a substrate;
 a gate electrode formed on the substrate;
 a gate insulating layer formed on the substrate to cover the gate electrode;
 an active layer formed of an oxide semiconductor and insulated from the gate electrode by the gate insulating layer;
 source and drain electrodes electrically coupled to the active layer; and
 an interfacial stability layer formed on at least one of top and bottom surfaces of the active layer, the interfacial stability layer being formed of an oxide having a band gap equal to or greater than a band gap of the active layer, wherein the interfacial stability layer directly contacts at least one of an entire to surface and an entire bottom surface of the active layer.

10. A thin film transistor (TFT), comprising:
 a substrate;
 a gate electrode formed on the substrate;
 a gate insulating layer formed on the substrate to cover the gate electrode;
 an active layer formed of an oxide semiconductor and insulated from the gate electrode by the gate insulating layer;
 source and drain electrodes electrically coupled to the active layer; and
 an interfacial stability layer formed on at least one of top and bottom surfaces of the active layer, an oxygen concentration of the interfacial stability layer being $10^{19}/cm^3$ or lower,
 wherein the interfacial stability layer directly contacts at least one of an entire top surface and an entire bottom surface of the active layer.

* * * * *